United States Patent
Hou

(10) Patent No.: US 6,989,487 B2
(45) Date of Patent: Jan. 24, 2006

(54) ELECTROMAGNETIC WAVE SHIELDING FILM

(76) Inventor: Pon-Wei Hou, 3Fl., 8 Hsin Ann Road, Science-Based Industrial Park, Hsinchu (TW)

( * ) Notice: Subject to any disclaimer, the term of this patent is extended or adjusted under 35 U.S.C. 154(b) by 0 days.

(21) Appl. No.: 10/329,930

(22) Filed: Dec. 23, 2002

(65) Prior Publication Data
US 2004/0000416 A1    Jan. 1, 2004

(30) Foreign Application Priority Data
Jun. 28, 2002    (TW) .............................. 91114239 A

(51) Int. Cl.
*H05K 9/00* (2006.01)
(52) U.S. Cl. .......................... 174/35 MS; 174/35 GC; 361/816; 361/818; 428/203; 428/204
(58) Field of Classification Search .......... 174/35 GC, 174/35 MS, 35 R; 361/816, 818; 428/203, 428/204, 209, 210
See application file for complete search history.

(56) References Cited

U.S. PATENT DOCUMENTS

| | | | | |
|---|---|---|---|---|
| 6,086,979 A | * | 7/2000 | Kanbara et al. | 428/209 |
| 6,195,034 B1 | * | 2/2001 | Tsuno et al. | 342/1 |
| 6,262,364 B1 | * | 7/2001 | Yoshikawa et al. | 174/35 MS |
| 6,297,446 B1 | * | 10/2001 | Cherniski et al. | 174/35 R |
| 6,448,492 B1 | * | 9/2002 | Okada et al. | 174/35 MS |

* cited by examiner

*Primary Examiner*—Dean A. Reichard
*Assistant Examiner*—Adolfo Nino
(74) *Attorney, Agent, or Firm*—Troxell Law Office, PLLC

(57) ABSTRACT

The present invention provides an electromagnetic wave shielding film having a plurality of holes formed thereon. The shielding film according to the present invention is made of conductive material and utilized as an independent film, a film disposed on a insulation substrate, or a film disposed on or laminated into a printed circuit board or semiconductor integrated circuit for preventing electromagnetic interference.

12 Claims, 7 Drawing Sheets

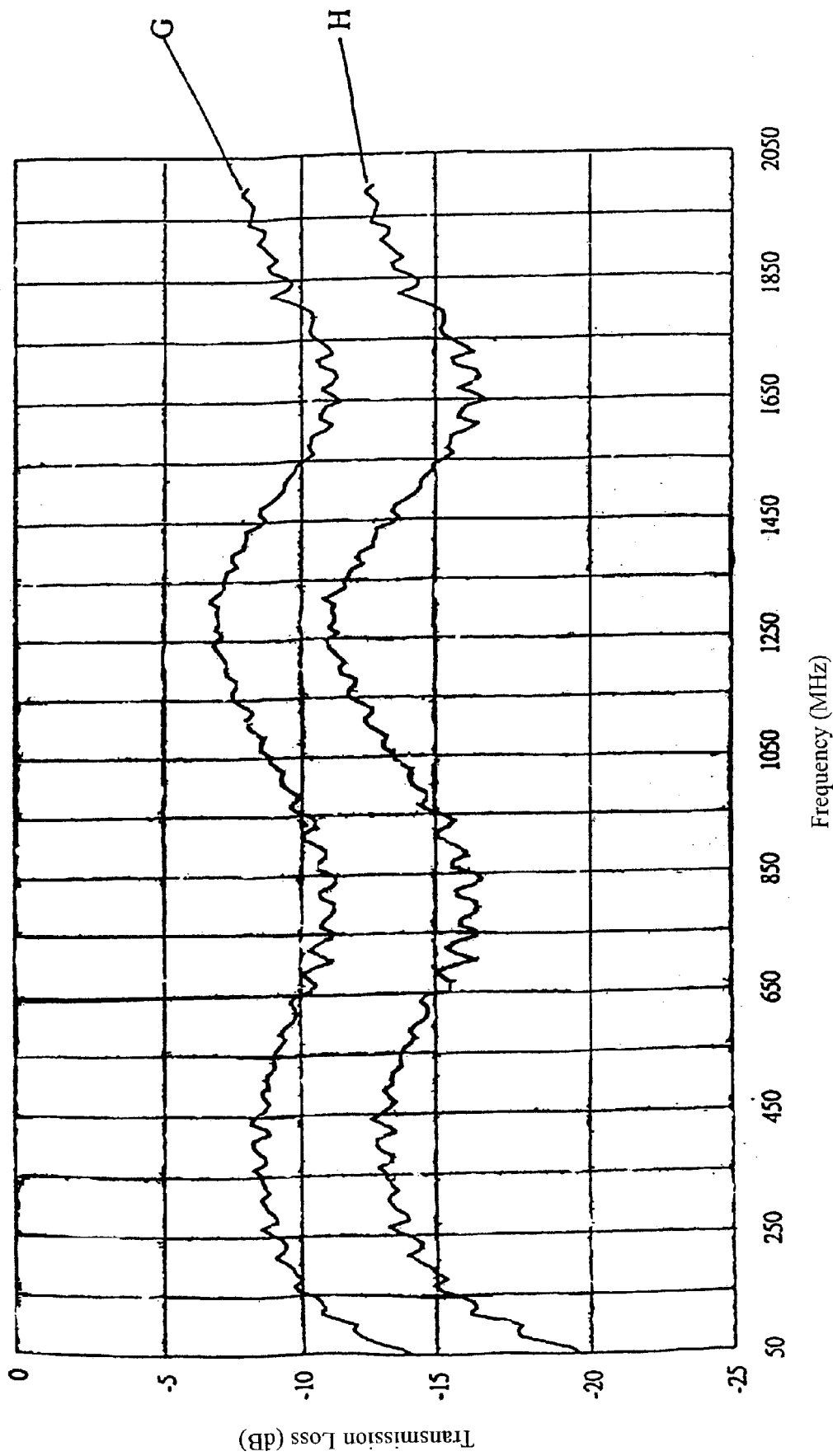

ELECTROMAGNETIC WAVE SHIELDING FILM

BACKGROUND OF THE INVENTION

1. Field of the Invention

The present invention generally relates to an electromagnetic wave shielding film, and more particularly to an electromagnetic wave shielding film having a plurality of holes formed thereon.

2. Description of the Related Art

It is well know that electromagnetic waves lead to interference in specific electric equipments and circuit components and affect the respective operations as a result. Recent research in the art has focused on the effect of electromagnetic waves on human beings. Certain devices for shielding electromagnetic waves are disposed on the building structures so as to avoid the interference effects of electromagnetic waves. Furthermore, the concept of electromagnetic wave shielding has been applied to apparel and fashion design to assure that the physical conditions of human beings are not adversely affected.

A method of preventing electromagnetic interference in the art is to utilize a shield to diminish the transmission power of electromagnetic waves. The electromagnetic wave shielding effect is primarily based on the thickness of the shield. That is, as the thickness of the shield increases, the transmission power of electromagnetic waves through the shield decreases, as the effect of electromagnetic waves is shielded.

Another method for preventing electromagnetic interference in the art is to utilize a conductive shielding gasket having conductive particles, metallic sheets or webs. However, there are disadvantages in such a method in the art. One drawback is that the manufacturing process of the conductive shielding gasket is significantly complex. For the metallic conductive sheets, heat dissipation becomes a significant problem since the metallic conductive sheets must wholly enclose the target being protected from electromagnetic interference. Further, the metallic conductive webs, as well as the metallic conductive sheets, should be pounded in shielding of electromagnetic waves. Although the conductivity of the metallic sheets and webs may be excellent and the shielding effect of the electric field is achieved, the shielding effect of the magnetic field in the art is not sufficiently satisfactory because of the high conductivity and/or grounding.

In addition, yet another method for preventing electromagnetic interference in the art is to utilize a plurality of strip-shaped conductive films or rectangular conductive films arranged on an insulating substrate. Taiwan, Republic of China Patent Publication No. 359046 entitled "Radio Wave Absorbing Plate" discloses an insulating substrate being provided with a plurality of conductive films of strip-shaped arranged thereon (with reference to FIG. 2) and an insulating substrate being provided with a plurality of rectangular conductive films arranged in an array (with reference to FIG. 3).

Therefore, there is a general need in the art for an electromagnetic wave shielding film, which effectively prevents electromagnetic interference.

There is a further need in the art for a compact and cost-effective electromagnetic wave shielding film.

SUMMARY OF THE INVENTION

The present invention provides an electromagnetic wave shielding film, which comprises a conductive film having a plurality of holes formed thereon. In accordance with Maxwell's equations, a current is induced to flow around the holes as electromagnetic waves are incident onto the conductive film. The flowing direction of the induced current is opposed to the direction of a magnetic field generated by the incident electromagnetic waves, where the magnetic field is accordingly neutralized and the electromagnetic waves shielded.

The shielding film according to the present invention is made of conductive material and utilized as an independent film, a film disposed on a insulation substrate, or a film disposed on or laminated into a printed circuit board or semiconductor integrated circuit for preventing electromagnetic interference.

BRIEF DESCRIPTION OF THE DRAWINGS

The above and other features and advantages of the present invention will become more apparent from the detailed description of preferred embodiments of the invention given herein and below when read in conjunction with the accompanying drawings, which are given by means of illustration only and thus not exhaustive of the various embodiments of the invention, in which:

FIG. 3C is a chart showing the relationship between the transmission loss and the frequency of the electromagnetic wave for conventional conductive shielding sponge EP3 and EP6, respectively.

DETAILED DESCRIPTION OF PREFERRED EMBODIMENTS

Figure 2:
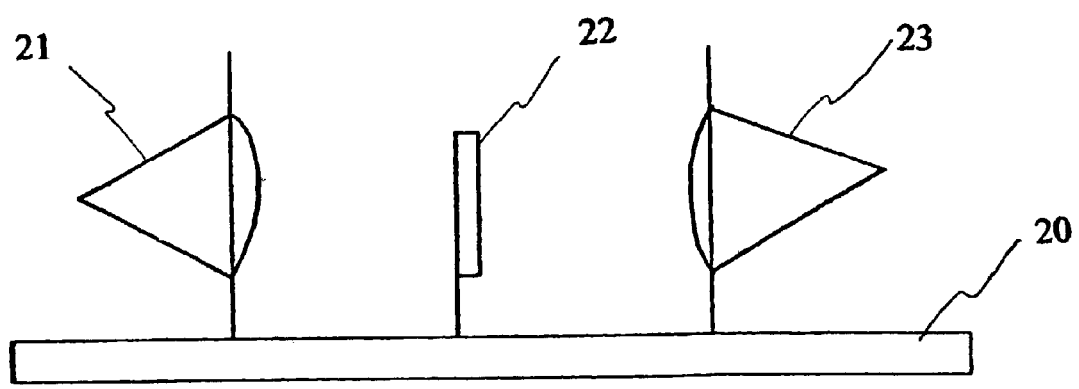
FIG. 2 is a schematic view showing a test device for measuring the transmission loss of electromagnetic wave.

The electromagnetic wave shielding film of the present invention is different from that of Taiwan Patent Publication No. 359046 in that the electromagnetic wave shielding film according to the present invention is a conductive film formed with a plurality of holes arranged in an array while that of Taiwan Patent Publication No. 359046 is a conductive film of strip shape or rectangular shape without any hole thereon disposed on an insulating substrate as shown in FIGS. 2 and 3.

The electromagnetic wave shielding film of the present invention is formed with a plurality of holes arranged in an array on the conductive film while that of Taiwan Invention Patent No. 359046 is provided with a plurality of rectangular conductive films in positions corresponding to the holes of the conductive film. The holes formed on the conductive film of the invention are arranged in an array, while the conductive films of Taiwan Invention Patent No. 359046 do not have any holes formed thereon being arranged in such an array.

Figure 1A:
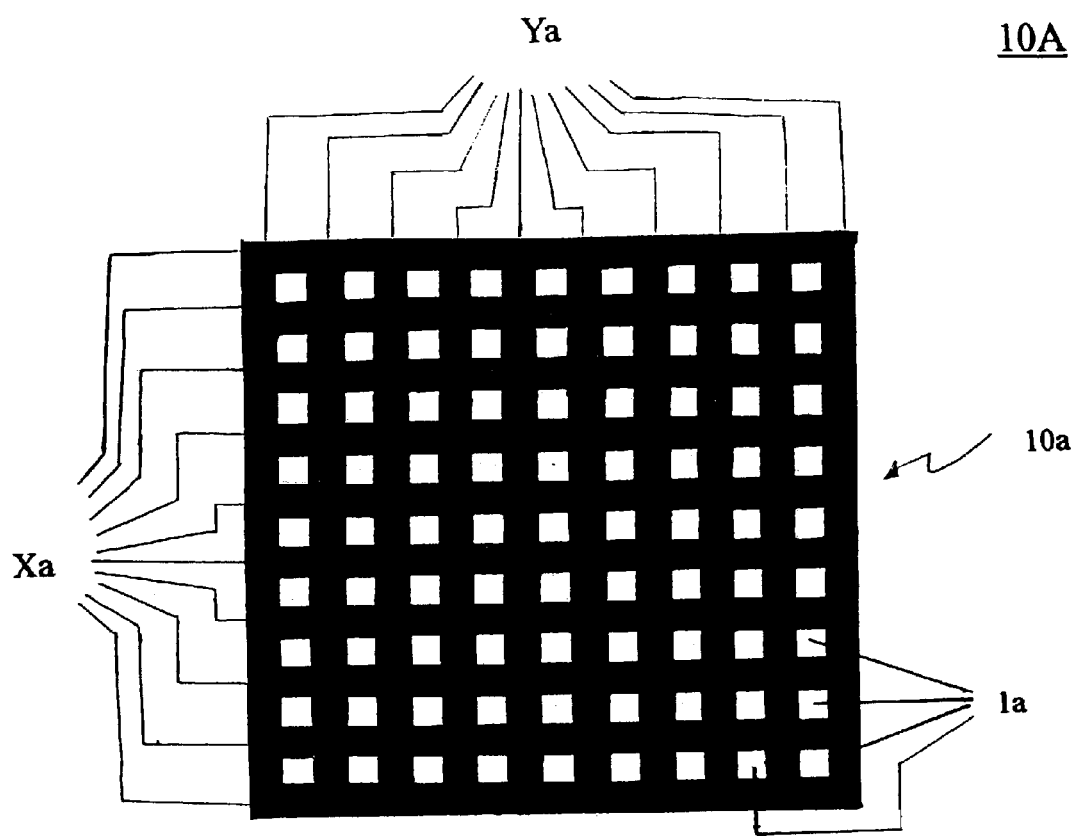
FIG. 1A illustrates an electromagnetic wave shielding film having a plurality of holes arranged thereon in accordance with a first embodiment of the present invention.

FIG. 1A illustrates an electromagnetic wave shielding film having a plurality of holes arranged thereon in accordance with a first embodiment of the present invention. With reference to FIG. 1A, an electromagnetic wave shielding film 10A according to the invention comprises a conductive film 10a having a plurality of holes 1a arranged in an array thereon. In FIG. 1A, white rectangular portions indicate the holes 1a, while the black intersecting portions indicate the conductive film 10a composed of a conductive film Xa running in x direction and a conductive film Ya running in y direction. The holes 1a are dimensioned and spaced apart with respect to each other based on the frequency of the electromagnetic waves to be shielded, the material of the shielding film and the specific application. In this particular embodiment, the dimension of each hole and the distance between adjacent holes are respectively selected to be 5 mm for illustrative purposes as set forth hereinbelow.

While the electromagnetic waves are incident onto the conductive film 10a formed with a plurality of holes 1a of the present invention, a current is induced that flows around the holes 1a of the conductive film 10a. A magnetic field is present as the current flows around the holes 1a. Since the direction of the magnetic field produced by the induced current is opposed to that of the magnetic field produced by the incident electromagnetic waves, the two magnetic fields are opposed. In other words, the electromagnetic wave shielding film 10A functions to block the incident electromagnetic waves.

Figure 1B:
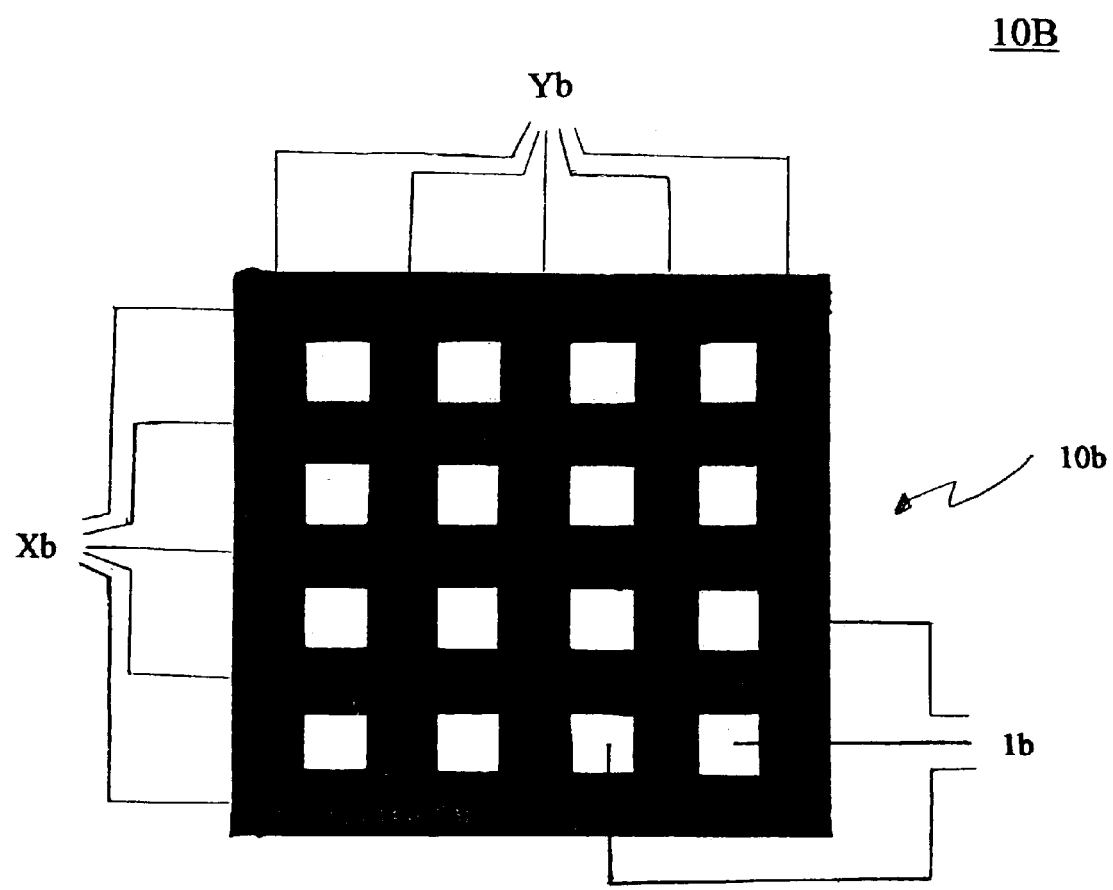
FIG. 1B illustrates an electromagnetic wave shielding film having a plurality of holes arranged thereon in accordance with a second embodiment of the present invention.

FIG. 1B illustrates an electromagnetic wave shielding film having a plurality of holes arranged thereon in accordance with a second embodiment of the present invention. FIG. 1B illustrates an electromagnetic wave shielding film 10B having a plurality of holes arranged thereon in accordance with a second embodiment of the present invention. In FIG. 1B, white rectangular portions indicate the holes 1b, while the black intersecting portions indicate the conductive film 10b. The difference between the shielding films of the first and second embodiments is that the dimension of each hole and the distance between adjacent holes in accordance with the second embodiment are respectively selected to be 10 mm for illustrative purposes as set forth hereinbelow.

Figure 1C:
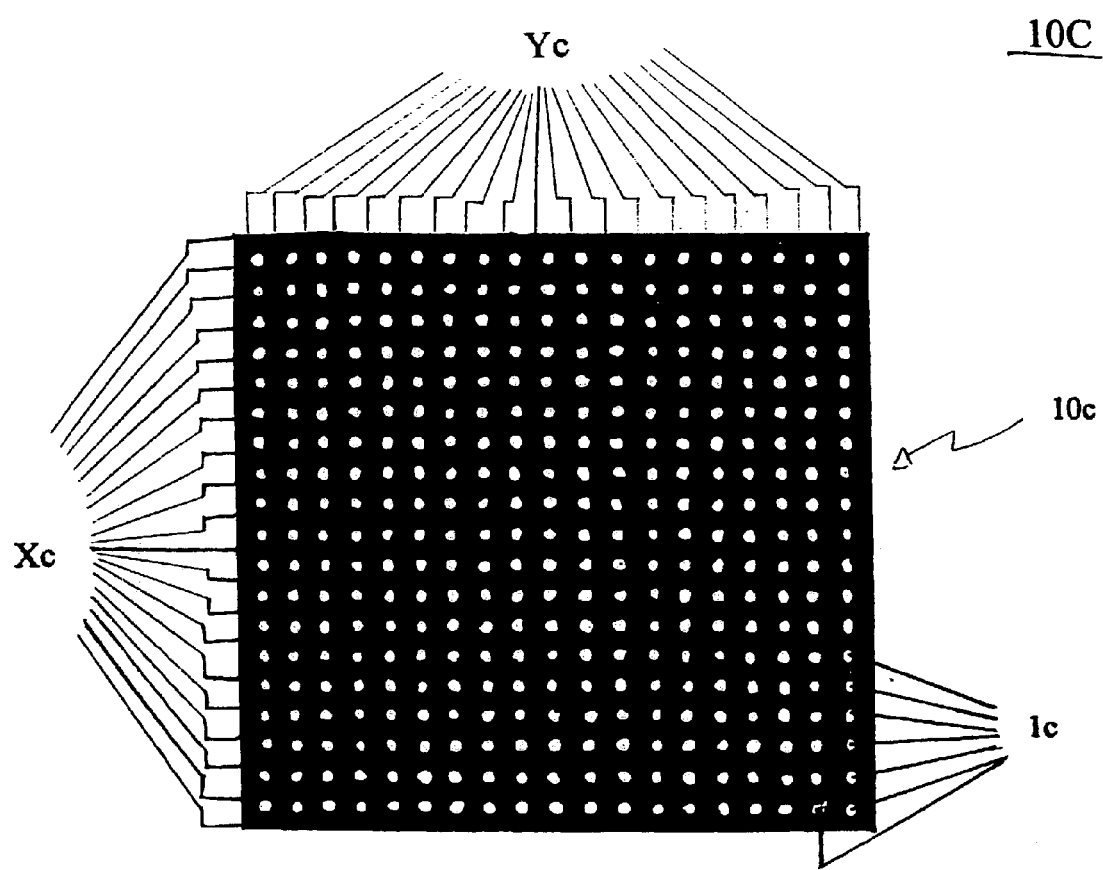
FIG. 1C illustrates an electromagnetic wave shielding film having a plurality of holes arranged thereon in accordance with a third embodiment of the present invention.

FIG. 1C illustrates an electromagnetic wave shielding film having a plurality of holes arranged thereon in accordance with a third embodiment of the present invention. FIG. 1C illustrates an electromagnetic wave shielding film 10C having a plurality of holes arranged thereon in accordance with a third embodiment of the present invention. In FIG. 1C, white circular portions indicate the holes 1c, while the black intersecting portions indicate the conductive film 10c. The difference between the shielding film of the third embodiment and those of the first and second embodiments is that the holes of the third embodiment are configured as circular holes and the dimension of each hole and the distance between adjacent holes 1c are respectively selected to be 2.5 mm for illustrative purposes as set forth hereinbelow.

In order to illustrate the effect for shielding electromagnetic waves of the present invention, the transmission loss of the electromagnetic waves is measured by the device shown in FIG. 2. First, a sample 22 to be measured, i.e., the electromagnetic wave shielding film of the present invention, is placed on a test table 20 for measuring the transmission loss of electromagnetic waves. An electromagnetic wave emitter 21 is disposed on one end of the test table 20, and an electromagnetic wave surveying device 23 is disposed on the other end of the test table 20. The emitter 21 is adapted to emit electromagnetic wave of specific band of frequency to the sample 22. The surveying device 23 is adapted to measure and analyze the electromagnetic waves received.

The electric surface resistance of the conductive films of the first, second and third embodiments is set to 1 ohm/□ (ohm/cm$^2$). A test for measuring the transmission loss of electromagnetic waves is conducted by utilizing the test device shown in FIG. 2 for the conductive films of the first, second and third embodiments. When the emitter 21 emits electromagnetic waves having a frequency in the range of 50 to 2650 MHz to the conductive films 10A, 10B and 10C, the transmission loss (dB) of electromagnetic waves measured by the surveying device 23 is shown in curves A, B and C of FIG. 3A.

Curve A corresponds to the conductive film 10A of the first embodiment in which each rectangular hole is dimensioned and spaced apart by 5 mm. Curve B corresponds to the conductive film 10B of the second embodiment in which each rectangular hole is dimensioned and spaced apart by 10 mm. Curve C corresponds to the conductive film 10C of the third embodiment in which each circular hole is dimensioned and spaced apart by 2.5 mm.

Figure 3A:
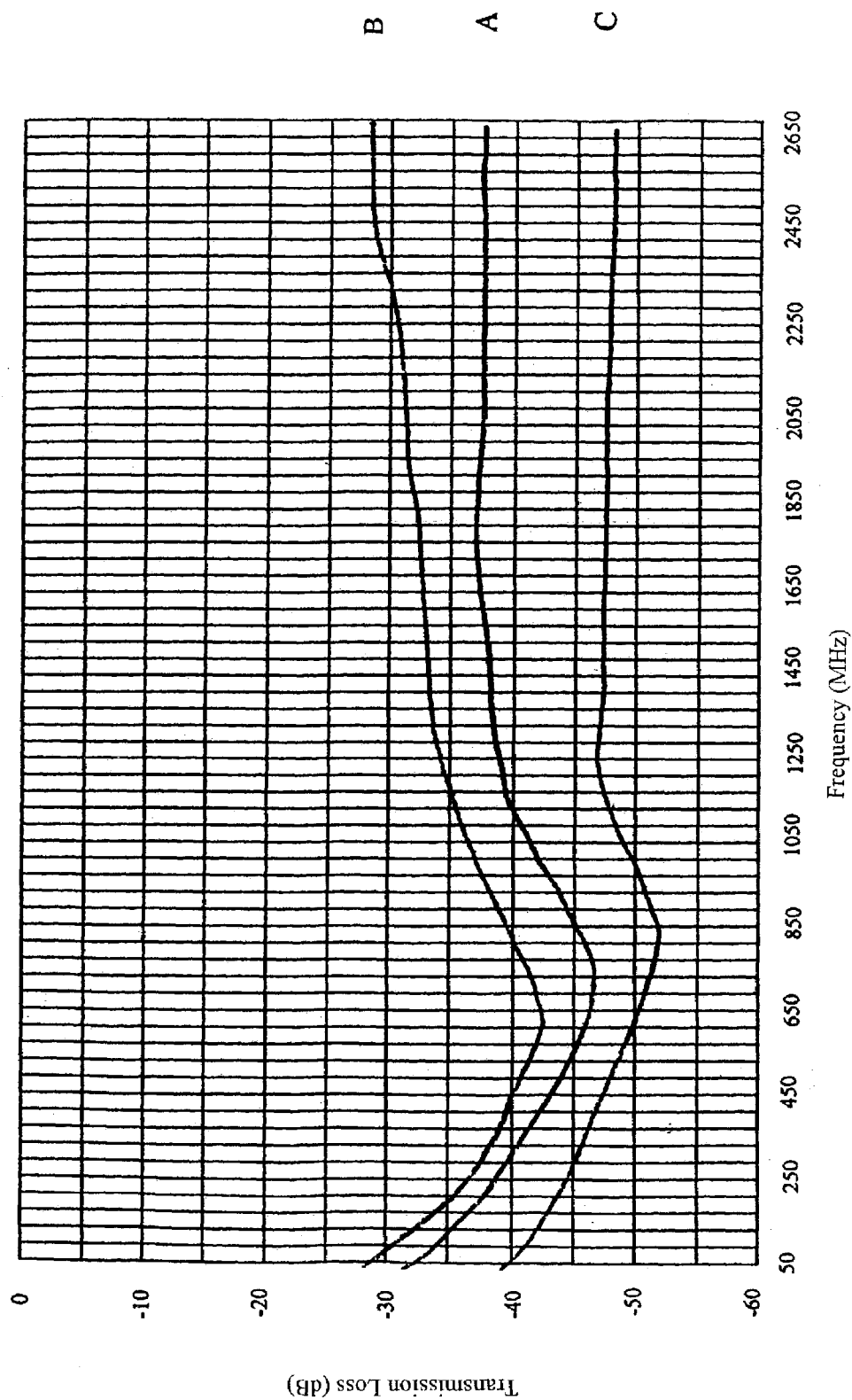
FIG. 3A is a chart showing the relationship between the transmission loss and the frequency of the electromagnetic wave for the electromagnetic wave shielding films in accordance with the first, second and third embodiments of the present invention, respectively.

In view of curves A, B and C in FIG. 3A, the transmission loss (dB) of electromagnetic waves is smaller if the dimension of holes and the paths for the induced currents are smaller. In addition, it is noted that as the frequency of the electromagnetic waves is in the range between 50 to 2650 MHz, the value of the transmission loss (dB) of electromagnetic waves is less than −30 dB, even less than −50 dB.

The test device shown in FIG. 2 is utilized in further illustrating the relationship between the surface resistance of the conductive film of the present invention and the transmission loss (dB) of electromagnetic waves. The surface resistance of the conductive film of the first embodiment is set to be 250 ohm/□, 130 ohm/□ and 5 ohm/□ while the dimension and the distance between the holes remain the same.

Figure 3B:
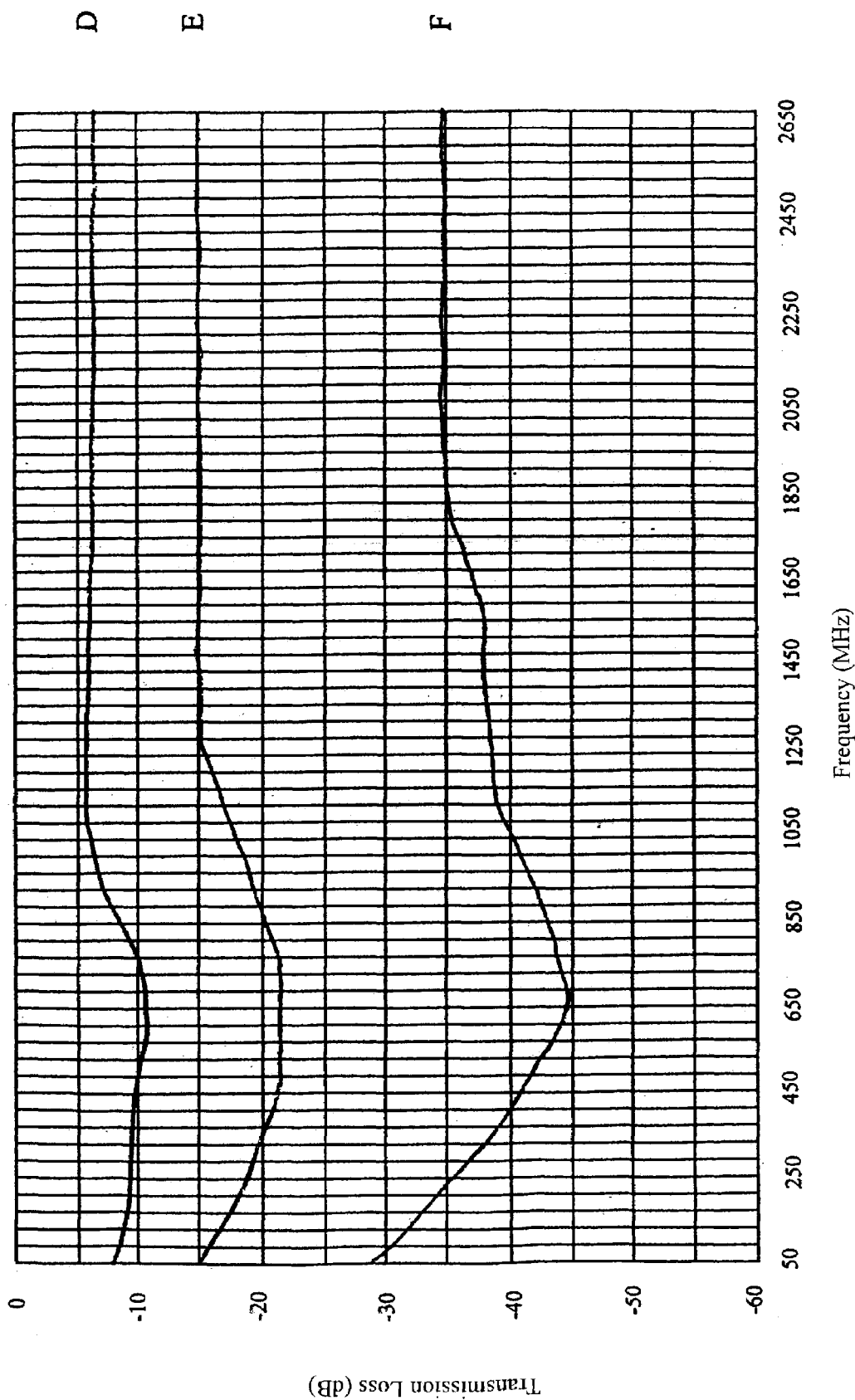
FIG. 3B is a chart showing the relationship between the transmission loss and the frequency of the electromagnetic wave for the electromagnetic wave shielding films having different surface resistances in accordance with the first embodiment of the present invention.

Referring to FIG. 3B, curve D represents the test result for the conductive film 10a with a surface resistance of 250 ohm/□. Curve 13 represents the test result for the conductive film 10a with a surface resistance of 130 ohm/□. Curve F represents the test result for the conductive film 10a with a surface resistance of 5 ohm/□. The transmission loss (dB) of electromagnetic waves is smaller if the surface resistance of the conductive film is smaller, which promotes the creation of induced currents. According to Maxwell's equations, a current will be induced to flow around the holes as electromagnetic waves are incident onto the conductive film. The induced current flow will be opposite to the direction of the magnetic field generated by the incident electromagnetic waves, and accordingly the magnetic field is neutralized and the electromagnetic waves shielded.

Referring to FIG. 3C, curve G represents the test result for conductive shielding sponge EP3 having a thickness of 3 mm. Curve H represents the test result for conductive shielding sponge EP6 having a thickness of 6 mm. In accordance with the test results shown in FIG. 3C, it is appreciated that the thicker the conductive shielding sponge is, the better the shielding effect of the conductive shielding sponge is due to the lesser transmission loss of the electromagnetic waves. The value of the transmission loss of the electromagnetic wave is ranged between −5 dB to −20 dB, which is significantly less than that of the conductive film according to the present invention.

For illustrative purposes, the preferred embodiments of the present invention are described by forming rectangular or circular holes on the conductive film. However, holes having square, oval, polygon or other shapes can be utilized as well. Holes having at least two different shapes can be formed on the conductive film. In addition to metal material such as gold, silver, copper, iron, aluminum, nickel, manganese, carbon, indium tin oxide (ITO) and alloys of the foregoing materials, conductive organic components or chemical compounds can be utilized to manufacture the conductive film in accordance with the present invention.

As to the application of the conductive film of the present invention, the conductive film can be disposed on or integrally laminated into electronic elements, parts, modules, semifinished products, products, cloth or outer walls of buildings, as well as independently attached to an insulation substrate by spin coating, evaporation coating, plasma coating, sputtering, printing, stamping, etching and lamination.

In order to prevent the conductive film attached to an insulation substrate from damage or scrape, another insulation film can be disposed on the conductive film. The insulation substrate and/or insulation film is preferably made of flexible material. Furthermore, the conductive film, insulation substrate and insulation film can be made of transparent material. For instance, indium tin oxide or ITO commonly utilized in thin film transistor liquid crystal displays (TFT LCDs) can be adopted to construct the conductive film of the invention so as to obtain the desired transparency.

Although the invention has been described with reference to the preferred embodiments, it will be understood that the invention is not limited to the details described thereof. Substitutions and modifications can be made by those skilled in the art without departing from the spirit and scope of the present invention. For example, a plurality of electromagnetic wave shielding films of the present invention can be laminated to further enhance the electromagnetic wave shielding effect. Therefore, all such substitutions and modifications are intended to be within the scope of the invention as defined in the appended claims and their equivalents.

I claim:

1. An electromagnetic wave shielding film, comprising: a non-grounded conductive film; a plurality of holes formed on the conductive film, wherein two adjacent holes are separated by a distance that is equal to a dimension of any of the plurality of holes, the dimension is selected from a group of dimensions consisting of a diameter of a circular hole and a diagonal length of a rectangular hole.

2. The shielding film in accordance with claim 1, wherein a first magnetic field incident upon the conductive film is neutralized by a second magnetic field generated by a current induced by the first magnetic field in the plurality of holes.

3. The shielding film in accordance with claim 1, wherein the plurality of holes are rectangular in shape and arranged in an array.

4. The shielding film in accordance with claim 3, wherein the diagonal length of each rectangular hole is in a range of 0.1 mm to 50 mm.

5. The shielding film in accordance with claim 1, wherein the plurality of holes are circular in shape and arranged in array.

6. The shielding film in accordance with claim 5, wherein the diameter of each circular hole is in a range of 0.1 mm to 50 mm.

7. The shielding film in accordance with claim 1, wherein the plurality of holes comprises an array of holes of at least two different shapes.

8. The shielding film in accordance with claim 1, wherein the conductive film comprises at least one of indium tin oxide, gold, silver, copper, iron, aluminum, nickel, manganese, carbon, alloy, conductive organic components and conductive chemical compounds.

9. The shielding film in accordance with claim 8, further comprising a first isolation film on which the conductive film is disposed.

10. The shielding film in accordance with claim 9, further comprising a second isolation film disposed on the conductive film.

11. The shielding film in accordance with claim 10, wherein the second isolation film comprises at least one of plastic, rubber, fabric and isolating chemical compound.

12. The shielding film in accordance with claim 9, wherein the first isolation film comprises at least one of plastic, rubber, fabric and isolating chemical compound.

* * * * *